(12) United States Patent
Yang et al.

(10) Patent No.: US 11,094,861 B2
(45) Date of Patent: Aug. 17, 2021

(54) DISPLAY DEVICE

(71) Applicant: LG Display Co., Ltd., Seoul (KR)

(72) Inventors: Kiyong Yang, Seoul (KR); MinJae Kang, Seoul (KR); YongSeok Kwak, Paju-si (KR); Myungsoo Han, Goyang-si (KR); JaeMin Sim, Jeongeup-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/550,735

(22) Filed: Aug. 26, 2019

(65) Prior Publication Data

US 2020/0075823 A1 Mar. 5, 2020

(30) Foreign Application Priority Data

Aug. 28, 2018 (KR) .................. 10-2018-0101479

(51) Int. Cl.
*H01L 33/60* (2010.01)
*H01L 27/15* (2006.01)
*H01L 27/12* (2006.01)
*H01L 33/50* (2010.01)

(52) U.S. Cl.
CPC .......... *H01L 33/60* (2013.01); *H01L 27/1214* (2013.01); *H01L 27/156* (2013.01); *H01L 33/50* (2013.01)

(58) Field of Classification Search
CPC ..... H01L 33/60; H01L 33/50; H01L 27/1214; H01L 27/156
USPC .......................................................... 257/88
See application file for complete search history.

(56) References Cited

U.S. PATENT DOCUMENTS

| | | | |
|---|---|---|---|
| 2007/0086211 A1 | 4/2007 | Beeson et al. | |
| 2012/0299017 A1 | 11/2012 | Chen et al. | |
| 2017/0062515 A1* | 3/2017 | Kim | ............... H01L 27/15 |
| 2017/0263672 A1* | 9/2017 | Seo | ............ H01L 25/0753 |
| 2018/0190631 A1* | 7/2018 | Kim | ............. G02F 1/13452 |

FOREIGN PATENT DOCUMENTS

| | | |
|---|---|---|
| EP | 3 343 273 A2 | 7/2018 |
| EP | 3 514 842 A2 | 7/2019 |
| KR | 10-2010-0015900 A | 2/2010 |

* cited by examiner

*Primary Examiner* — Tong-Ho Kim
(74) *Attorney, Agent, or Firm* — Seed IP Law Group LLP

(57) ABSTRACT

Provided is a display device. The display device includes a substrate having a sub-pixel area. In some examples, the substrate may have or define a plurality of sub-pixel areas. A light-emitting diode (LED) and a thin-film transistor for driving the LED are disposed in the sub-pixel area. An extended light path layer is disposed on the substrate and is configured to surround the sub-pixel area. Accordingly, it is possible so as to improve the luminous efficiency of the display device.

19 Claims, 10 Drawing Sheets

DISPLAY DEVICE

CROSS-REFERENCE TO RELATED APPLICATION

This application claims the priority of Korean Patent Application No. 10-2018-0101479 filed on Aug. 28, 2018, in the Korean Intellectual Property Office, the disclosure of which is incorporated herein by reference.

BACKGROUND

Technical Field

The present disclosure relates to a display device, and more particularly to a display device using light-emitting diodes.

Description of the Related Art

Liquid-crystal display devices (LCDs) and organic light-emitting display devices (OLEDs), which have been widely used up to now, find more and more applications.

Liquid-crystal display devices and organic light-emitting display devices are widely employed as the screen of typical electronic devices such as mobile phones and laptop computers because they can provide high resolution image and can be made thin and light.

However, liquid-crystal display devices and organic light-emitting display devices include a bezel that is seen by a viewer and does not display an image, and thus the display area is reduced by the size of the bezel. For example, a liquid-crystal display device requires a sealant used to seal the liquid-crystal molecules and to attach the upper substrate and the lower substrate together, and thus there are limitations in decreasing the size of the bezel. In addition, an organic light-emitting display device typically includes an encapsulation layer to protect organic light-emitting diodes since the organic light-emitting diodes are made of an organic material and thus are very vulnerable to moisture or oxygen. There are limitations in decreasing the size of the bezel.

In view of such shortcomings of liquid-crystal display devices and organic light-emitting display devices, display devices including LEDs have been proposed. LEDs are made of an inorganic material rather than an organic material and thus are more reliable. Accordingly, display devices including LEDs have a long lifetime as compared with liquid-crystal display devices or organic light-emitting display devices. In addition, the LEDs can be turned on and off quickly, consume less power, are robust to impact resistance and stable, and can display a high-brightness image. Accordingly, LEDs are advantageous for large screens.

BRIEF SUMMARY

In order to fabricate a display device including such LEDs, a single pixel is implemented by using three LEDs including red (R), green (G) and blue (B) LEDs. However, in order to implement a pixel by using three LEDs, there are many processes such as a process of growing each of the LEDs on a donor substrate and a process of transferring the LEDs grown on the donor substrate to the substrate of the display device. As a result, there is a problem that color deviations occur due to a process failure or depending on a temperature and an environment.

Previously, only the blue LEDs are grown on the donor substrate or directly grown on the substrate of a display device, and the color conversion layer including quantum dots that can represent red and green colors is disposed to change the wavelength so that light of red and green colors are represented.

The inventors of the present disclosure have recognized that it is advantageous to increase the light path in order to prevent leakage of blue light and improve the efficiency of the color conversion layer when only the blue LEDs are used as described above.

In order to increase the light path in a display device using LEDs, the thickness of the color conversion layer may be increased. However, there are process limitations in increasing the thickness of the color conversion layer. More specifically, a color conversion layer that converts the color of light emitted from a blue LED into red or green is typically formed by using a photolithography (PR) process. By using the photolithography process, the thickness of approximately 3 µm can be achieved by spin coating, which is insufficient. Further, in order to increase the thickness of the color conversion layer, a high-viscosity photoresist should be used, which may decrease uniformity and processibility.

In view of the above, the inventors of the present disclosure have devised a novel display device that can increase the light path without increasing the thickness of the color conversion layer.

In some embodiments, the present disclosure provides a display device capable of improving the display efficiency of a display device by way of increasing the light path.

In some embodiments, the present disclosure provides a display device having a smaller thickness by way of decreasing the thickness of a color conversion layer.

According to an embodiment of the present disclosure, there is provided a display device including: a substrate having a sub-pixel area. A light-emitting diode (LED) and a thin-film transistor for driving the LED are disposed in the sub-pixels area. An extended light path layer is configured to surround the sub-pixel area. The extended light path layer may be extended in a horizontal direction of the sub-pixel area. Accordingly, in the display device according to an embodiment of the present disclosure, the path of light emitted from an LED becomes longer by virtue of the extended light path layer which is extended in the horizontal direction to the area where the transistor (which may be a thin-film transistor) is disposed from the LED, thereby improving the luminous efficiency of the LED.

According to another embodiment of the present disclosure, there is provided a display device including a substrate having a plurality of sub-pixels. A thin-film transistor is disposed in an emission area of each of the sub-pixels. At least one LED is disposed in a reflection area of each of sub-pixels. An extended light path layer is disposed in the emission area and the reflection area. A first reflective layer is disposed on the extended light path layer in the reflection area. The emission area may not overlap with the reflection area. In the display device according to an embodiment of the present disclosure, the first reflective layer and the second reflective layer are disposed on and under the LED, so that it is possible to increase the luminous efficiency of light emitted from the LED and to suppress leakage of light to the outside.

According to yet another embodiment of the present disclosure, a display device is provided that includes a substrate, a transistor on the substrate, and a light-emitting diode (LED) on the substrate and electrically coupled to the transistor. An extended light path layer overlies the transistor and the LED, and the extended light path layer is configured to receive light emitted by the LED and to transmit the light to an emission area overlying the transistor.

According to some embodiments of the present disclosure, the extended light path layer is disposed above an LED, and thus the path of the light emitted from the LED becomes longer, so that the luminous efficiency of the display device can be improved.

According some embodiments of the present disclosure, as the extended light path layer is extended in the horizontal direction of the sub-pixel and thus the thickness in the vertical direction is not increased, it is possible to improve the luminous efficiency without increasing the thickness of the display device.

According to some embodiments of the present disclosure, it is possible to suppress leakage of light emitted from the LED by disposing a reflective layer on the extended light path layer in line with the LED.

According to some embodiments of the present disclosure, the extended light path layer may further include a color conversion material to improve not only the brightness of the display device but also reduce the power consumption.

According to some embodiments of the present disclosure, the extended light path layer may further include a diffusing agent to improve the diffusion of light emitted from the LED.

It should be noted that the contents of the present disclosure described in the problems, the solutions to the problems, and the effects described above do not specify essential features of the various embodiments provided herein.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
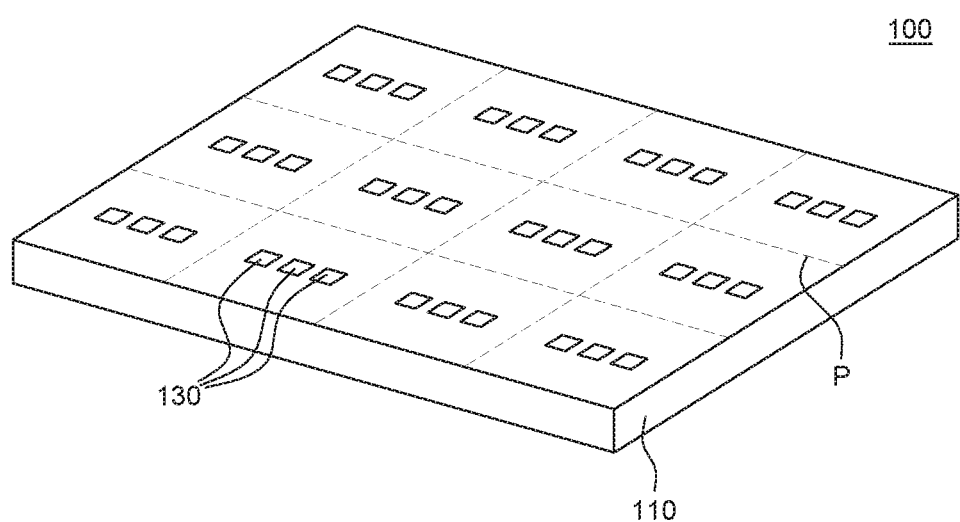
FIG. 1 is a schematic perspective view of a display device according to one or more embodiments of the present disclosure.

Advantages and characteristics of the present disclosure and a method of achieving the advantages and characteristics will be clear by referring to the embodiments described below in detail together with the accompanying drawings.

However, the present disclosure is not limited to the embodiments disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range (e.g., a tolerance range) even if not expressly stated.

When the position relation between two elements is described using the terms such as "on", "above", "below", and "next", one or more elements may be positioned between the two parts unless the terms are used with the term "immediately" or "directly".

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Each of the features of the various embodiments of the present disclosure can be combined or bonded with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

FIG. 1 is a schematic perspective view of a display device according to one or more embodiments of the present disclosure.

Referring to FIG. 1, a display device 100 according to one or more embodiments of the present disclosure includes a substrate 110 and a plurality of light-emitting diodes (LEDs) 130 disposed on the substrate 110.

The substrate 110 is for supporting elements on the display device 100 and may be an insulating substrate. For example, the substrate 110 may be made of a transparent material such as glass and a resin. In addition, the substrate 110 may include a polymer or a plastic material. In some embodiments, the substrate 110 may be made of a plastic material having flexibility.

On the substrate 110, pixel areas may be defined. Although not shown in the drawings, the substrate 110 may be a thin-film transistor (TFT) array substrate, and the plurality of LEDs 130 and thin-film transistors and a variety of lines for driving the LEDs 130 may be formed in the pixel area P on the upper surface of the substrate 110. When the thin-film transistors are turned on, driving signals input from an external device through the lines are applied to the LEDs 130, so that the LEDs 130 emit light to display an image.

Three sub-pixels emitting light of red (R), green (G) and blue (B), respectively, are arranged in each pixel area P of the substrate 110, and an LED 130 emitting light of the same color is disposed in each sub-pixel. As the LEDs 130 emitting light of the same color are disposed in the sub-pixels of the display device 100, an extended light path layer that can convert the color of light and can extend the light path is disposed above the LEDs 130 for allowing the sub-pixels to emit light of red, green or blue lights. The extended light path layer will be described in more detail with reference to FIGS. 2 to 6.

According to one or more embodiments of the present disclosure, the LEDs 130 may be formed via a process different from the TFT array process of the substrate 110 or may be formed on the substrate 110 of the display device 100 on which the thin-film transistors are disposed.

According to some embodiments of the present disclosure, the LEDs 130 of the display device 100 may be LEDs having a size of 10 to 100 µm, i.e., LEDs in micro size. The size of the LEDs, as referred to herein, may be a size of any dimension of the LEDs, such as a height, width, or length of the LEDs. In some embodiments, the LEDs may have a size of each of a height, width, and length that is within a range from 10 to 100 µm. The LEDs 130 may be formed by growing a plurality of thin films of an inorganic material such as Al, Ga, N, P, As and In on a sapphire substrate or a silicon substrate and then cutting or separating the sapphire substrate or the silicon substrate, or may be formed by growing a thin film on the substrate 110 where thin-film transistors are disposed. Since the LEDs 130 can be formed in a small size, they can be formed on a flexible substrate such as a plastic substrate. In addition, unlike an organic emissive layer, the LEDs 130 are formed by growing an inorganic material as thin films and thus the fabricating process is simple and the yield can be improved. In addition, the LEDs 130 made of an inorganic material have a high brightness and a long lifetime as compared with the LED made of an organic light-emitting material.

Although not shown in the drawings, the pixel areas P may be defined by a plurality of gate lines and a plurality of data lines. The gate lines and the data lines are electrically connected to the LEDs 130. Gate pads and data pads connected to an external source are disposed at the ends of the gate lines and the data lines, respectively, so that external signals are applied to the LEDs 130 through the gate lines and the data lines, and accordingly the LEDs 130 emit light.

Figure 2:
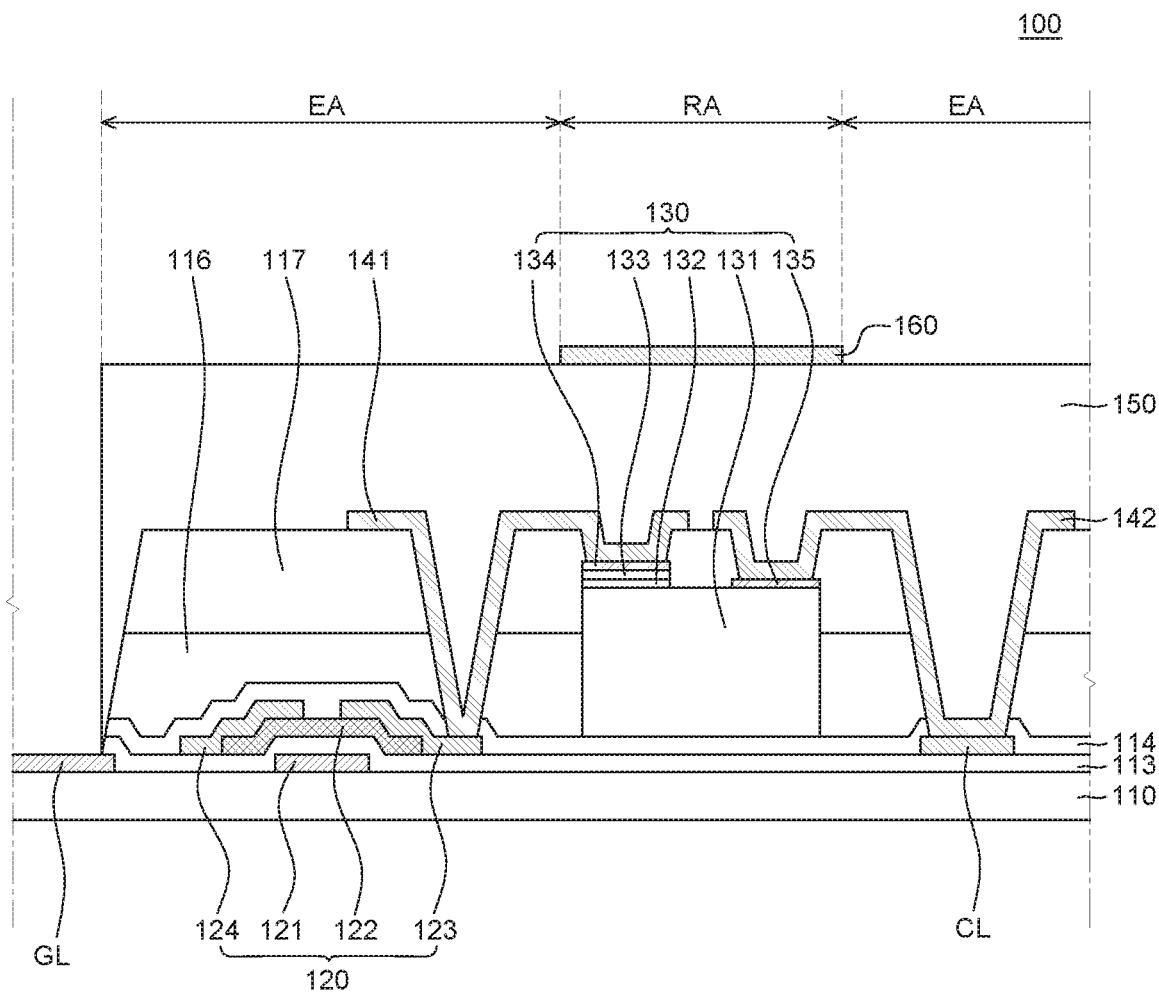
FIG. 2 is a cross-sectional view showing a structure of a display device according to one or more embodiments of the present disclosure in detail.
Figure 3A:
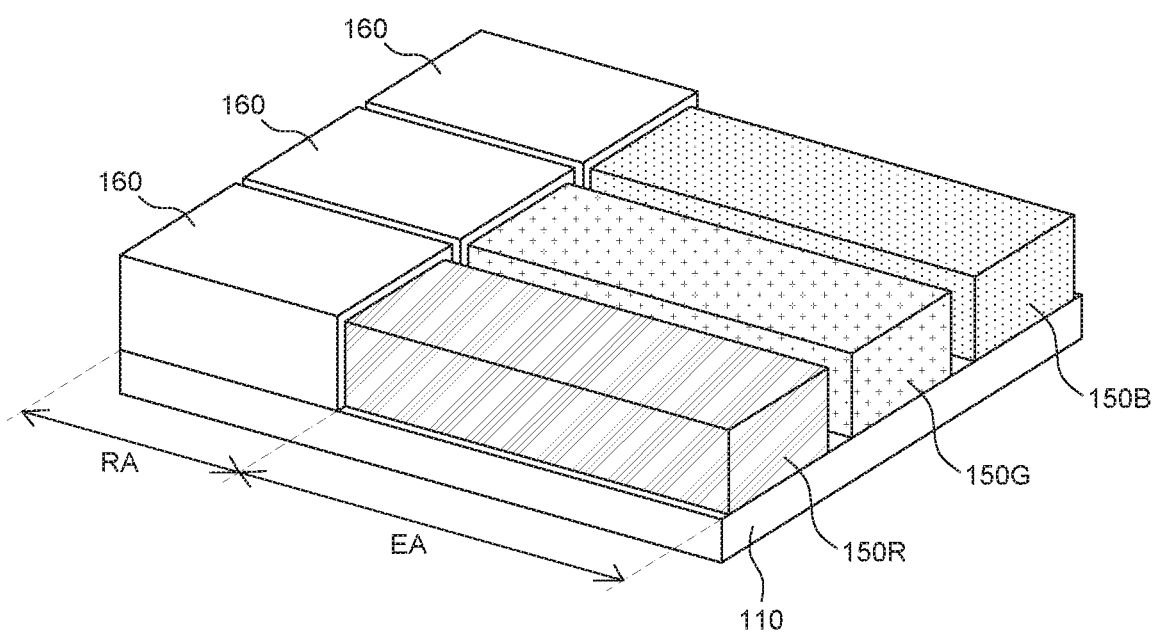
FIGS. 3A to 3C are perspective views of extended light path layers and reflective layers of display devices according to various embodiments of the present disclosure.
Figure 3B:
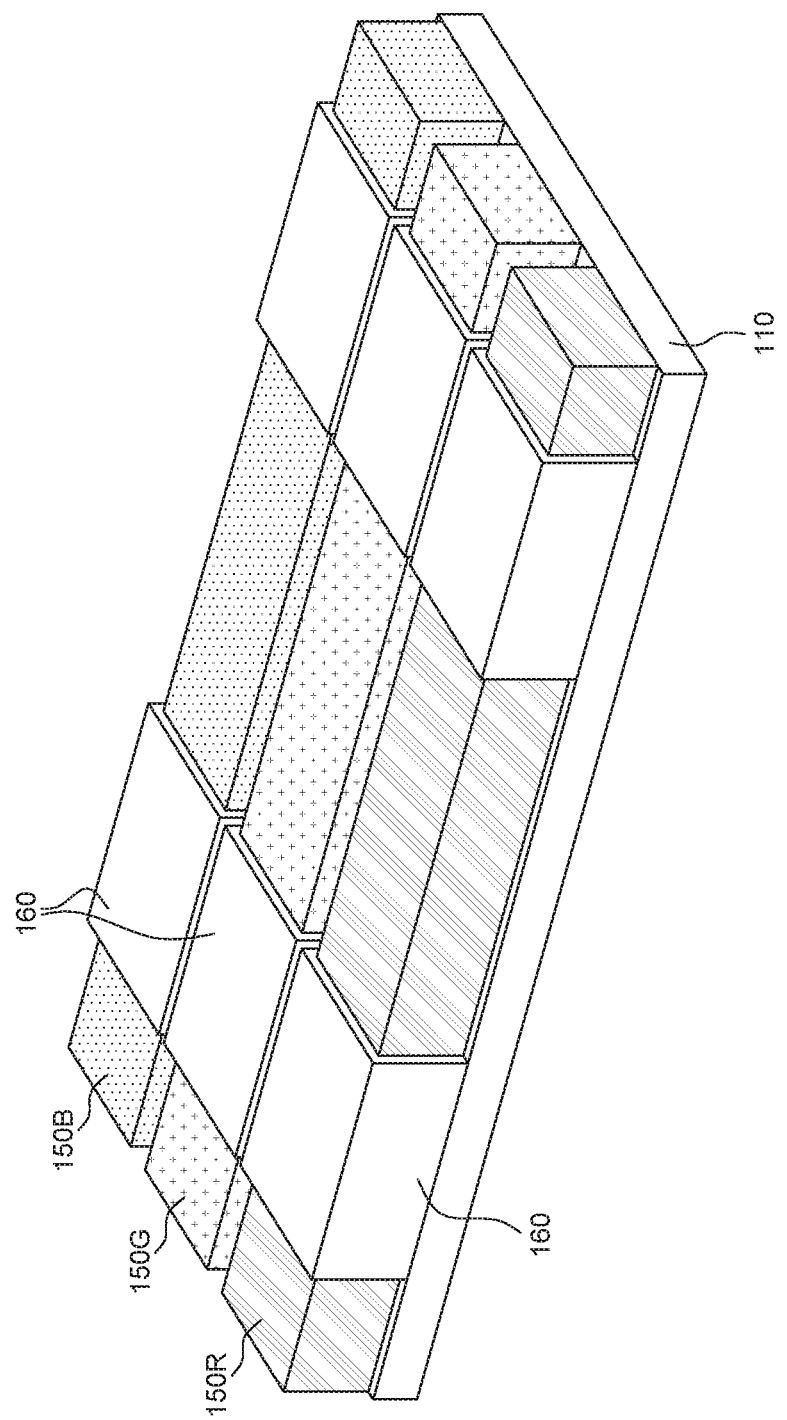
Figure 3C:
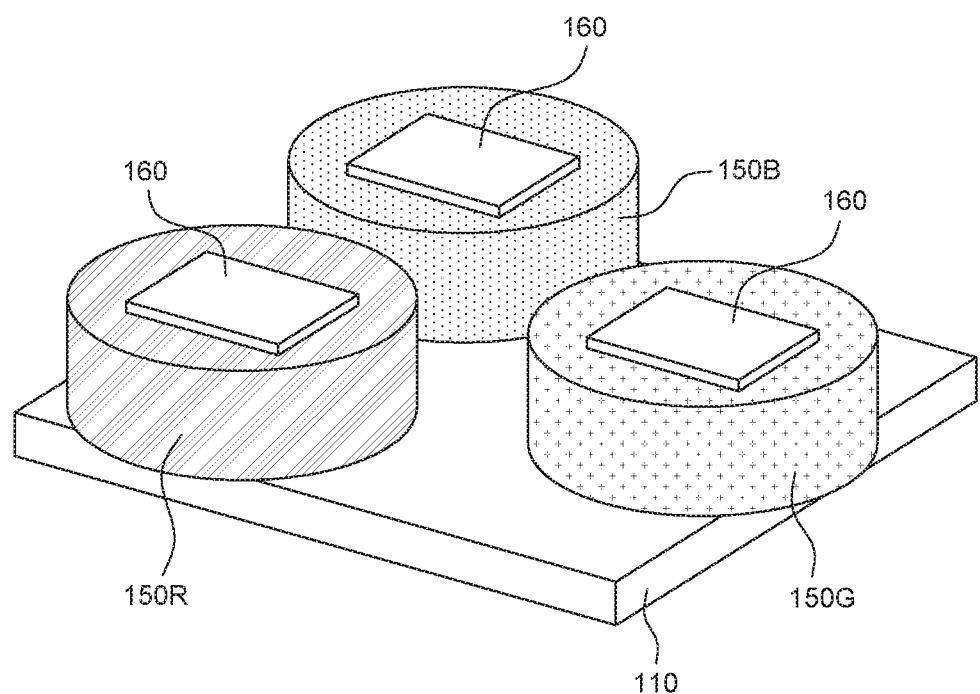
Figure 4A:
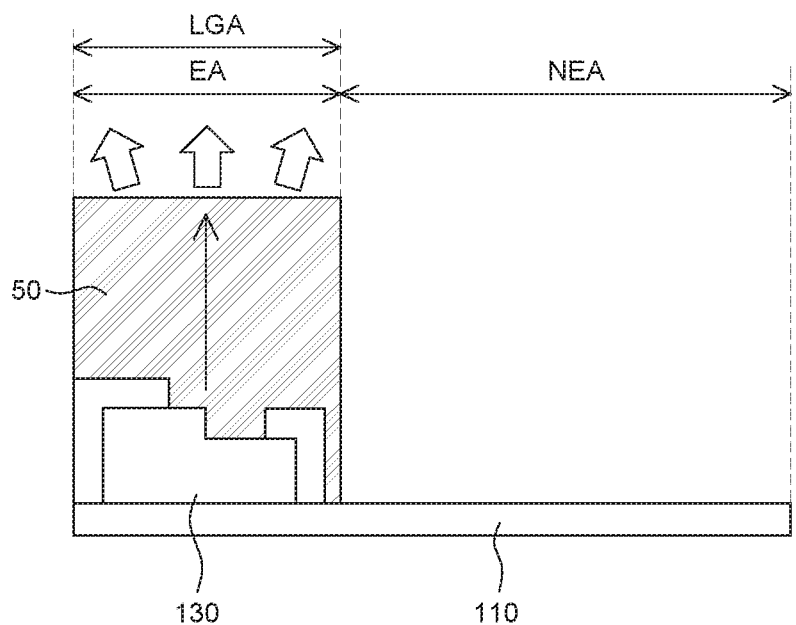
FIGS. 4A and 4B are cross-sectional views showing a display device according to a Comparative Example, and a display device according to one or more embodiments of the present disclosure.
Figure 4B:
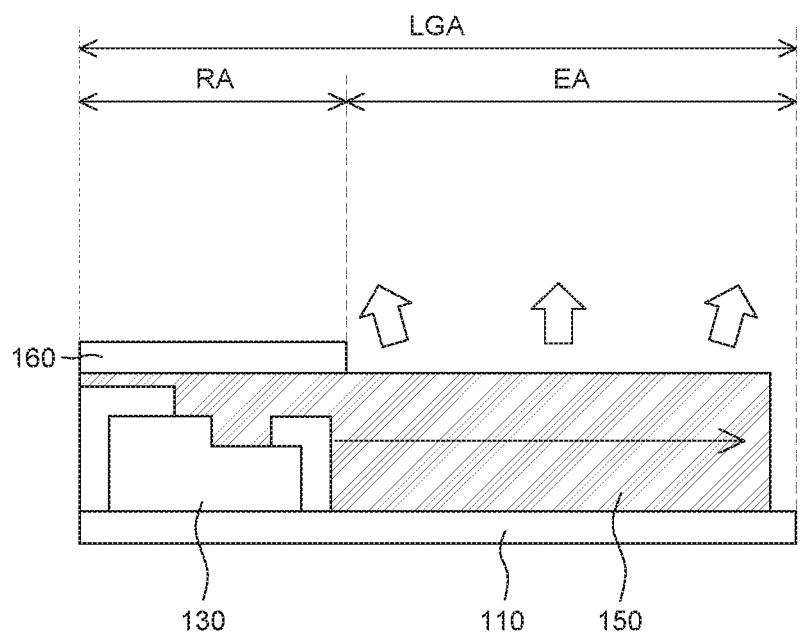

FIG. 2 is a cross-sectional view showing a structure of a display device according to one or more embodiments of the present disclosure in detail. FIGS. 3A to 3C are perspective views of extended light path layers and reflective layers of display devices according to various embodiments of the present disclosure. FIGS. 4A and 4B are cross-sectional views showing a display device according to one or more embodiments of the present disclosure and a display device according to Comparative Example.

Referring to FIG. 2, a thin-film transistor 120 is formed on the substrate 110. The thin-film transistor 120 includes a gate electrode 121, an active layer 122, a source electrode 123, and a drain electrode 124. Specifically, a gate electrode 121 is disposed on the substrate 110, and the active layer 122 is disposed on the gate electrode 121. A gate insulating layer 113 for insulating the active layer 122 from the gate electrode 121 is disposed between the gate electrode 121 and the active layer 122. The source electrode 123 and the drain electrode 124 are disposed on the active layer 122, and a passivation layer 114 is disposed on the source electrode 123 and the drain electrode 124 for protecting the thin-film transistor 120. A hole may be formed in the passivation layer 114 to expose a part of the source electrode 123 of the thin-film transistor 120. In some implementations, the passivation layer 114 may be eliminated. Although a bottom-gate transistor is shown in FIG. 2, the present disclosure is not limited thereto. That is to say, a thin-film transistor having a variety of structures such as a top-gate thin-film transistor as well as a bottom-gate transistor can be applied.

A gate line GL is formed on the same layer as the gate electrode 121. The gate line GL may be made of the same material as the gate electrode 121. Although the gate line GL is shown in FIG. 2, the data line DL may be formed in the same manner as the gate line GL.

A common line CL is disposed on the gate insulating layer 113. The common line CL is for applying a common voltage to the LED 130 and may be disposed apart from the gate line GL or the data line DL. In addition, the common line CL may be extended in the same direction as the gate line GL or the data line DL. The common line CL may be made of the same material as the source electrode 123 and the drain electrode 124 as shown in FIG. 2. However, the common line CL may be made of the same material as the gate electrode 121 as well. The passivation layer 114 is formed on the common line CL, with a hole formed therein, via which a part of the common line CL is exposed.

Referring to FIG. 2, the LED 130 is disposed on the gate insulating layer 113 or the passivation layer 114. The LED 130 may be located between the two emission areas EA. Although not shown in FIG. 2, an adhesive layer may be disposed on the passivation layer 114 to reinforce the adhesion of the LED 130 disposed on the passivation layer 114. The adhesive layer may be disposed when the LED 130 is grown on a donor substrate and then transferred onto the substrate 110 of the display device 100. When the LED 130 is grown directly on the substrate 110 of the display device 100, the adhesive layer may be eliminated.

The LED 130 shown in FIG. 2 is an LED 130 having a lateral structure and includes an n-type layer 131, an active layer 132, a p-type layer 133, an n-electrode 135 and a p-electrode 134. According to some embodiments of the present disclosure, the LED 130 having the lateral structure is employed as the LED 130, but the structure of the LED 130 is not limited thereto. The LED 130 is electrically connected to the thin-film transistor 120, but it is desired that they are not overlapped.

The structure of the LED 130 will be described in more detail. The n-type layer 131 may be formed by implanting n-type impurity into gallium nitride having good crystallinity. The active layer 132 is disposed on the n-type layer 131. The active layer 132 is an emissive layer of the LED 130 that emits light and may be formed of a nitride semiconductor, for example, indium gallium nitride. The p-type layer 133 is disposed on the active layer 132. The p-type layer 133 may be formed by implanting p-type impurity into gallium nitride. It is, however, to be understood that the n-type layer 131, the active layer 132 and the p-type layer 133 are not limited thereto.

As described above, after the n-type layer 131, the active layer 132 and the p-type layer 133 are sequentially stacked, a predetermined portion may be etched out, and then the n-electrode 135 and the p-electrode 134 may be formed. The predetermined portion is a space for separating the n-electrode 135 from the p-electrode 134. The predetermined portion may be etched out so that a part of the n-type layer 131 is exposed. In other words, the surface of the LED 130 on which the n-electrode 135 and the p-electrode 134 are disposed is not flat, and the n-electrode 135 and the p-electrode 134 may have different levels.

As such, the n-electrode 135 may be disposed on the etched portion, i.e., on the n-type layer 131 that is exposed via an etching process. The n-electrode 135 may be made of a conductive material, for example, a transparent conductive oxide. On the other hand, the p-electrode 134 may be disposed on the non-etched region, that is, on the p-type layer 133. The p-electrode 134 may be made of a conductive material, for example, a transparent conductive oxide. In addition, the p-electrode 134 may be made of the same material as the n-electrode 135.

Subsequently, a first planarization layer 116 and a second planarization layer 117 are formed on the upper surface of the substrate 110. Referring to FIG. 2, the first planarization layer 116 is disposed to provide a flat surface over the thin-film transistor 120. The first planarization layer 116 may be formed in a region except the region where the LED 130 and contact holes are disposed to provide a flat surface. In addition, the second planarization layer 117 may be disposed on the first planarization layer 116. The second planarization layer 117 may be disposed over the thin-film transistor 120 and the LED 130 except the contact holes. The second planarization layer 117 may be formed such that a part of the p-electrode 134 and a part of the n-electrode 135 of the LED 130 are opened. Although the display device 100 according to some embodiments of the present disclosure includes two planarization layers in the example shown in FIG. 2, this is merely illustrative. If a single planarization layer is formed, the processing time may be too long. Accordingly, by disposing the two planarization layers, it is possible to reduce the processing time. Accordingly, the planarization layers 116 and 117 are not necessarily formed as a plurality of layers as shown in FIG. 2, but may be formed as a single planarization layer.

Referring to FIG. 2, the first electrode 141 is disposed to electrically connect the thin-film transistor 120 with the p-electrode 134 of the LED 130. The first electrode 141 is electrically connected to the source electrode 123 of the thin-film transistor 120 through a contact hole formed through first planarization layer 116, the second planarization layer 117 and the passivation layer 114, and is electrically connected to the p-electrode 134 of the LED 130 through a contact hole formed through the second planarization layer 117. It is, however, to be understood that the present disclosure is not limited thereto. The first electrode 141 may be electrically connected to the drain electrode 124 of the thin-film transistor 120 depending on the type of the thin-film transistor.

The second electrode 142 is an electrode for connecting the common line CL with the n-electrode 135 of the LED 130. The second electrode 142 is electrically connected to the common line CL through a contact hole formed through first planarization layer 116, the second planarization layer 117 and the passivation layer 114, and is electrically connected to the n-electrode 135 of the LED 130 through a contact hole formed through the second planarization layer 117.

Accordingly, when the display device 100 is turned on, different voltage levels applied to the source electrode 123 of the thin-film transistor 120 and the common line CL are applied to the p-electrode 134 and the n-electrode 135 through the first electrode 141 and the second electrode 142, respectively, such that the LED 130 can emit light. Although the thin-film transistor 120 is electrically connected to the p-electrode 134 and the common line CL is electrically connected to the n-electrode 135 in the example shown in FIG. 2, this is merely illustrative. The thin-film transistor 120 may be electrically connected to the n-electrode 135 and the common line CL may be electrically connected to the p-electrode 134.

An extended light path layer 150 is disposed above the thin-film transistor 120 and the LED 130. The extended light path layer 150 prevents leakage of light emitted from the LED 130 and improves luminous efficiency. The extended light path layer 150 may be made of a transparent resin such as polymethylmetacrylate (PMMA), polyethylene terephthlate (PET), poly carbonate (PC) and polyethylene naphthalate (PEN).

The extended light path layer 150 may further include a color conversion material, for example, quantum dots or a fluorescent material. Accordingly, in the display device 100 according to one or more embodiments of the present disclosure, the blue light emitted from the LED 130 can be converted into the light of the wavelength of each of the sub-pixels, i.e., into red light in a red sub-pixel and green light in a green sub-pixel by the color conversion material contained in the extended light path layer 150.

Different color conversion materials may be contained in the extended light path layer 150 of different sub-pixels. For example, if the color conversion material included in the extended light path layer 150 disposed in a red sub-pixel is a first color conversion material, the color conversion material included in the extended light path layer 150 disposed in a green sub-pixel may be a second color conversion material different from the first color conversion material. It is to be noted that the extended light path layer 150 disposed in a blue sub-pixel may contain no color conversion material. In addition, a proportion of the color conversion material contained in the extended light path layer of a sub-pixel may be different from that of another sub-pixel. For example, if the color conversion material contained in the extended light path layer 150 of a red sub-pixel has a first proportion, the color conversion material contained in the extended light path layer 150 of a green sub-pixel may have a second proportion.

In addition, the extended light path layer 150 may further include a diffusing agent. The diffusing agent may be added during the process of forming a transparent base material of the extended light path layer 150, or may be included in the extended light path layer 150 by printing or coating it onto the transparent base material after it is formed. The diffusing agent may be, for example, silica, aluminum hydroxide, aluminum oxide, zinc oxide, acrylic, polyurethane, polyvinyl chloride series, etc. In the display device 100 according to some embodiments of the present disclosure, the extended light path layer 150 includes the diffusing agent so that the light can be diffused by the diffusing agent after the wavelength is converted and can exit to the outside. In addition, the diffusing agent included in the extended light path layer may have different proportions for different sub-pixels. For example, if the diffusing agent included in the extended light path layer 150 of a red sub-pixel has a first proportion, the diffusing agent included in the extended light path layer 150 of a green sub-pixel may have a second proportion. In addition, no diffusing agent may be included in the extended light path layer 150 of some sub-pixels.

The extended light path layer 150 disposed in each of a red sub-pixel and a green sub-pixel may further include a light absorbing agent capable of absorbing light of a certain wavelength band to improve the color gamut. For example, the light absorbing agent can absorb light in the wavelength band between the red light emitted from the red sub-pixel and the green light emitted from the green sub-pixel, allowing for pure red and green to be displayed or transmitted by the extended light path layer 150. Alternatively, the light absorbing agent can absorb light in the wavelength band between the blue light emitted from the blue sub-pixel and the green light emitted from the green sub-pixel, allowing for pure green and blue to be displayed or transmitted by the extended light path layer 150. The light absorbing agent may be, for example, at least one of fluorescent quencher selected from fluorescent dyes of cyanine, rhodamine and porphyrin series.

As described above, the LEDs 130 disposed in the sub-pixels of the display device 100 according to some embodiments of the present disclosure may be LEDs emitting the light of the same color. For example, according to one or more embodiments of the present disclosure, the LEDs 130 emit blue light B, and the extended light path layer 150 including a color conversion material capable of converting the blue light into red and green lights is disposed above the LEDs 130, such that red sub-pixels, green sub-pixels, and blue sub-pixels can be formed. In addition, although not shown in the drawings, a black matrix may be disposed to prevent color mixing among the red sub-pixel, the green sub-pixel, and the blue sub-pixel.

The extended light path layer 150 may be extended from the thin-film transistor 120 to the second electrode 142 electrically connected to the common line CL including the region of the LED 130. In some embodiments, the extended light path layer 150 may cover the thin-film transistor 120, the LED 130, and the second electrode 142. In some embodiments, the extended light path layer 150 may surround a sub-pixel area for which it is disposed. For example, the extended light path layer 150 may surround a sub-pixel area of the substrate 110 corresponding to an area of a sub-pixel in which a thin-film transistor 120, LED 130, and the second electrode 142 are disposed. Referring to FIGS. 3A to 3C, the extended light path layer 150 may have a planar shape extended in the horizontal direction of the sub-pixels. By virtue of the extended light path layer 150, the display device 100 according to some embodiments of the present disclosure may have a longer path of light emitted from the LEDs 130. The extended light path layer 150 may be configured to form a light path through which light emitted from the LED 130 is transmitted to a location overlapping the thin-film transistor 120.

FIG. 4A shows a Comparative Example of a display device which is illustrated for comparison with one or more embodiments of the present disclosure. As shown in FIG. 4A, in the comparative example display device, a color conversion layer 50 is disposed to allow LEDs 130 to emit light of different colors in different sub-pixels. The color conversion layer 50 is disposed where the LEDs 130 are disposed. That is to say, the thin-film transistor which does not overlap with the LED 130 may be disposed in a non-emission area NEA while the LED 130 is disposed in an emission area EA. Accordingly, in the comparative example display device, a light guide area (LGA) in which light emitted from the LED 130 is guided can be formed only in the area where the LED 130 is disposed. In other words, as shown in FIG. 4A, the emission area EA is substantially identical to the light guide area LGA in the comparative example display device.

In addition, as shown in FIG. 4A, in order to improve luminous efficiency of light emitted from the LED 130, it has been proposed to increase the light path by increasing the thickness of the color conversion layer 50 in the vertical direction. However, there are limitations in increasing the thickness of the color conversion layer 50 in the vertical direction, and if the thickness is increased, the display device becomes thick.

In contrast, referring to FIG. 4B showing the display device 100 according to one or more embodiments of the present disclosure, the extended light path layer 150 is disposed not only over the LED 130 but also in the area where the thin-film transistors disposed (e.g., laterally adjacent to the LED 130 on the substrate 110) which does not overlap with the LED 130. The extended light path layer 150 may be disposed to surround the pixel area in the horizontal direction of the pixel area in which the pixels are arranged. More specifically, the LED 130 and the thin-film transistor are disposed in the pixel area, and the extended light path layer 150 may be disposed from the LED 130 to the area where the thin-film transistor is disposed. Accordingly, the extended light path layer 150 can serve as a light path for guiding light emitted from the LED 130, and the area where the extended light path layer 150 is disposed can be the light guide area (LGA). That is to say, in the display device 100 according to embodiments of the present disclosure, the path of the light emitted from the LED 130 becomes long or extended along a first direction, which may be a direction parallel to a surface of the substrate, for example, along which the thin-film transistor and the LED 130 are disposed (e.g., in the horizontal direction as shown in FIG. 4B). As described above, the display device 100 according to some embodiments of the present disclosure can increase the luminous efficiency of the display device 100 by extending the path of the light emitted from the LED 130 in the horizontal direction.

In addition, as shown in FIGS. 3A to 3C, as the extended light path layer 150 extends the path of the light in the horizontal direction of the sub-pixels 150R, 150G and 150B, it is possible to reduce the thickness of the display device 100.

A reflective layer 160 may be disposed on the extended light path layer 150.

The reflective layer 160 may be disposed on the extended light path layer 150 in line with the LED 130, for example, the reflective layer 160 may overlap the LED 130 and may be aligned with the LED 130 along a direction (e.g., a vertical direction) transverse to the extension direction of the extended light path layer 150. The reflective layer 160 may be made of any reflective material, and in some embodiments, the reflective layer 160 may be made of a metal material such as titanium dioxide ($TiO_2$). By disposing the reflective layer 160, it is possible to suppress leakage of light emitted from the LED 130 to the outside.

The reflective layer 160 may be disposed to surround at least one surface of each sub-pixel. For example, the reflective layer 160 may be disposed to surround four or three faces of the side surfaces of each sub-pixel, as shown in FIGS. 3A and 3B.

Initially, as shown in FIG. 3A, the reflective layer 160 according to one or more embodiments of the present disclosure may be formed on the extended light path layer 150 in line with the LED 130, i.e., in a reflection area RA. The reflective layer 160 may be disposed to surround the upper surface and the three side surfaces of each of the sub-pixels 150R, 150G, and 150B. Accordingly, it is possible to suppress leakage of light emitted from the LED 130 to the outside, and more light can be emitted in the emission area EA.

In addition, as shown in FIG. 3B, the reflective layer 160 according to some embodiments of the present disclosure may be formed on the extended light path layer 150 in line with the LED 130, i.e., in a reflective area RA. The reflective layer 160 may be disposed to surround the upper surface and two side surfaces of each of the sub-pixels 150R, 150G, and 150B. Accordingly, it is possible to suppress leakage of light emitted from the LED 130 to the outside, and more light can be emitted in the emission area EA.

The sub-pixels R, G and B according to some embodiments of the present disclosure may have a cuboid shape extended in the horizontal direction, i.e., in the longitudinal direction as shown in FIGS. 3A and 3B or may have a circular, cylindrical, disc, or dome shape as shown in FIG. 3C. Although FIGS. 3A and 3B illustrate a rectangular parallelepiped shape, this is merely illustrative. They may have a lenticular lens shape extended in the horizontal direction. As shown in FIG. 3C, the reflective layer 160 may be disposed on the upper surface of the extended light path layer 150 in line with the LED 130 for each of the sub-pixels 150R, 150G and 150B.

The extended light path layer 150 may be formed as follows: a mold having a size equal to or slightly larger than the size of the extended light path layer 150 is prepared. Then, the mold is filled with a transparent resin. A press jig is placed above the extended light path layer 150. It is pressed with the press jig, such that the extended light path layer 150 having a planar shape (e.g., a planar upper surface) can be formed.

In addition, although the reflective layer 160 is formed in the reflection area RA of the extended light path layer 150 in the examples shown in FIGS. 3A and 3B, this is merely illustrative. For example, when the reflective layer 160 is formed on the lower surface and/or the side surface of the emission area EA, leakage of light to the outside can be reduced and accordingly the luminous efficiency of light exiting toward the upper side can be further improved.

The emission area EA and the reflection area RA may be defined on the substrate 110 by the extended light path layer 150 and the reflective layer 160.

In the emission area EA, light emitted from the LED 130 exits. The emission area EA is in line with (or may overlap) the thin-film transistor 120. That is, the emission area EA may overlap the thin-film transistor 120, and further may extend laterally (e.g., horizontally) beyond edges of the thin-film transistor 120, since the extended light path layer 150 may completely overlap and may extend beyond edges of the thin-film transistor 120. In addition, the second electrode 142 may also be disposed in the emission area EA. As described above, the extended light path layer 150 according to one or more embodiments of the present disclosure is extended in the horizontal direction of the sub-pixels, so that the emission area EA is extended compared to an existing display device where the emission area EA is formed only in line with the LED 130, thereby increasing the luminous efficiency. The emission area EA may include a first emission area and a second emission area, and the LED 130 may be positioned between the first and second emission areas EA as shown, for example, in FIG. 2.

In the reflection area RA, light emitted from the LED 130 is reflected, for example, the light may be reflected by the reflective layer 160 back into the extended light path layer 150. The reflection area RA may be in line with the reflective layer 160. By disposing the reflection area RA, leakage of light to the outside can be reduced.

Although not shown in FIG. 2, a passivation layer may be further disposed on the extended light path layer 150 and the reflective layer 160.

Figure 5:
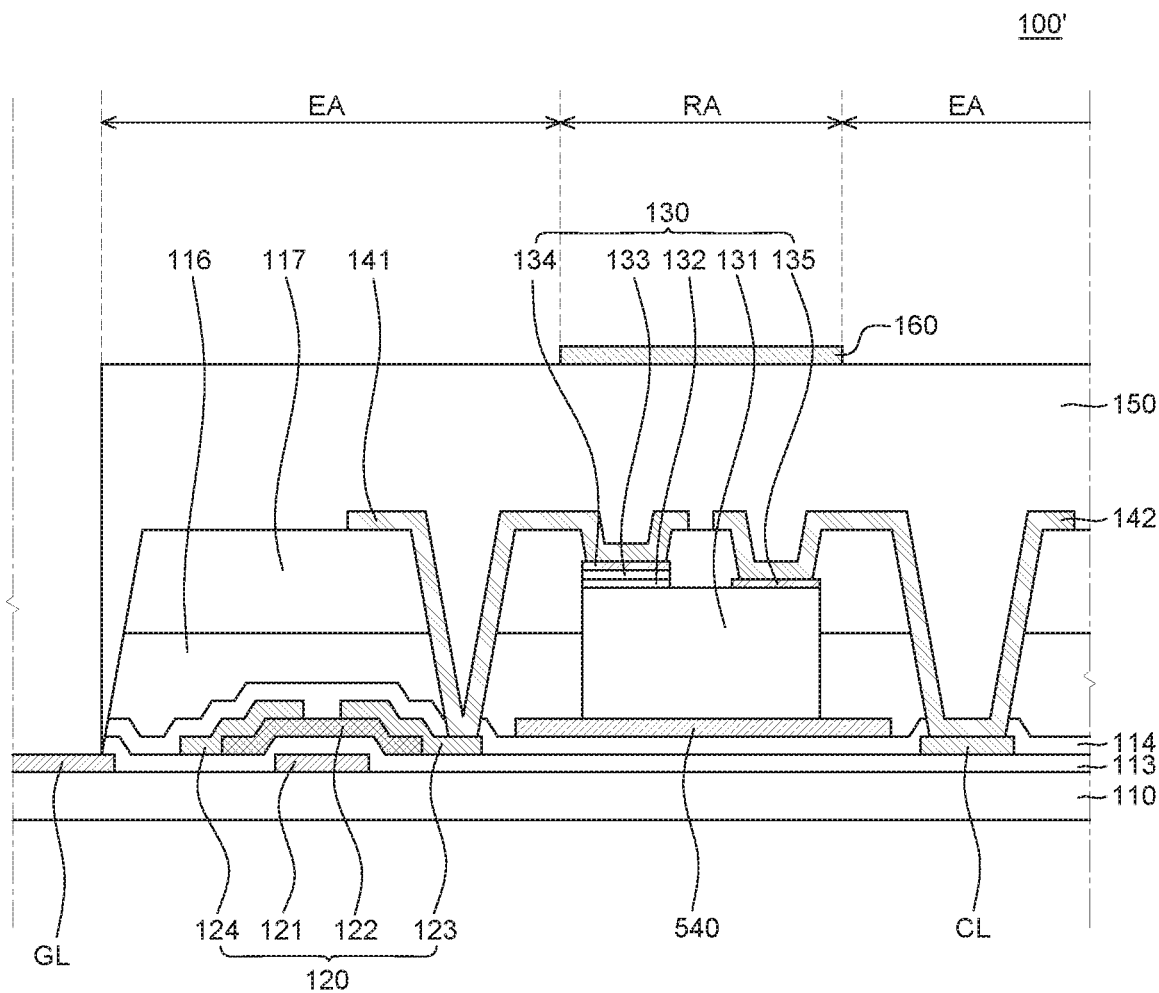
FIG. 5 is a cross-sectional view showing a structure of a display device according to one or more embodiments of the present disclosure in detail.

FIG. 5 is a cross-sectional view showing a structure of a display device according to one or more embodiments of the present disclosure in detail.

Referring to FIG. 5, a display device 100' according to another embodiment of the present disclosure may include a thin-film transistor 120, an LED 130, a first electrode 141, a second electrode 142, an extended light path layer 150, a first reflective layer 540, and a second reflective layer 160. The display device 100' is substantially identical to the display device 100 shown in FIG. 2 except that the first reflection layer 540 is further disposed; and, therefore, the redundant description will be omitted.

In the display device 100', the first reflective layer 540 is disposed on the passivation layer 114 disposed on the thin-film transistor 120.

The first reflective layer 540 reflects light emitted from the LED 130 toward the substrate 110 toward the upper side of the display device 100' and guides the light to the outside of the display device 100'. The first reflective layer 540 may be made of a metal material having a high reflectivity.

The LED 130 may be disposed on the first reflective layer 540, and the extended light path layer 150 and the second reflective layer 160 may be disposed above the LED 130. Although not shown in FIG. 5, an adhesive layer may be further disposed between the first reflective layer 540 and the LED 130 to reinforce the adhesion therebetween. The adhesive layer may be disposed when the LED 130 is grown on a donor substrate and then transferred onto the substrate 110 of the display device 100'. When the LED 130 is grown directly on the substrate 110 of the display device 100', the adhesive layer may be eliminated. As such, the display device 100' includes the first reflective layer 540 and the second reflective layer 160 on and under the LED 130, respectively, so that it is possible to prevent leakage of light emitted from the LED 130 and to improve the luminous efficiency of the display device.

Figure 6:
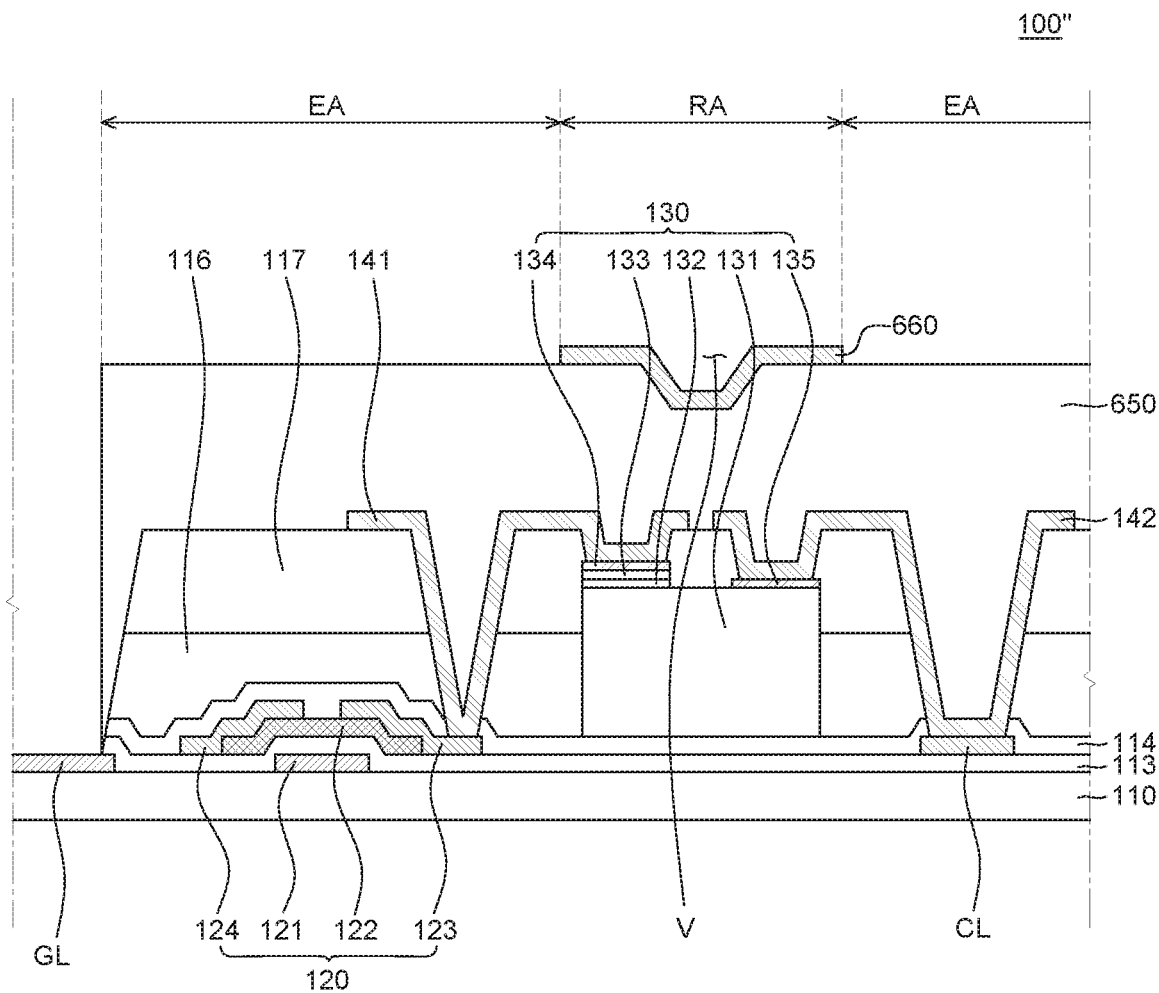
FIG. 6 is a cross-sectional view showing a structure of a display device according to one or more embodiments of the present disclosure in detail.

FIG. 6 is a cross-sectional view showing a structure of a display device according to yet another embodiment of the present disclosure in detail.

Referring to FIG. 6, a display device 100" may include a thin-film transistor 120, an LED 130, a first electrode 141, a second electrode 142, an extended light path layer 650, and a reflective layer 660. The display device 100" is substantially identical to the display device 100 shown in FIG. 2 except that an extended light path layer and a reflective layer have different shapes; and, therefore, the redundant description will be omitted.

In the display device 100", an extended light path layer 650 including a groove V is disposed above the LED 130. The groove V may be disposed in line with (e.g., aligned or overlapping with) the LED 130. The groove V may be formed in the extended light path layer 650 with a predetermined angle. The path of the light emitted from the LED 130 can be changed by the side surface of the groove V having the predetermined angle. As the light emitted from the LED 130 is refracted by the groove V, the light can exit more evenly and widely. That is to say, the groove V formed in the extended light path layer 650 can scatter light emitted from the LED 130, thereby improving the luminous efficiency of the display device. Although the groove V is shown as having a cup shape in FIG. 6, the shape of the groove V is not particularly limited as long as the luminous efficiency can be improved. In addition, according to some embodiments, the single groove V is formed in the extended light path layer 650 in FIG. 6. It is, however, to be understood that the present disclosure is not limited thereto. More than one grooves V may be formed. If a number of grooves V are formed in the extended light path layer 650, the path of the light emitted from the LED 130 can be changed several times, and thus the light can propagate more widely and evenly so that the luminous efficiency can be further improved.

The reflective layer 660 may be disposed conforming to the shape of the groove V. The reflective layer 660 may also be disposed in line with the LED 130.

As described above, the display device 100" includes the extended light path layer 650 having the groove V in line with the LED 130, and the reflective layer 660 formed on the extended light path layer 650 along the shape of the groove V, so that the outcoupling efficiency can be further improved.

Figure 7A:
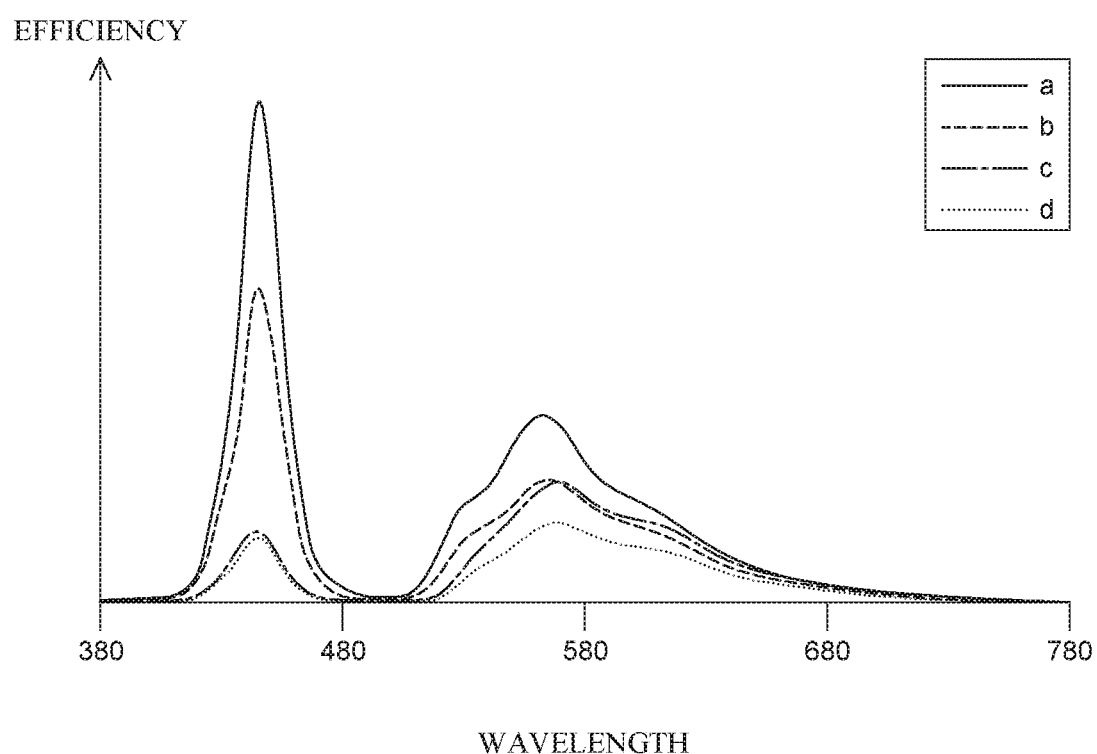
FIGS. 7A and 7B are graphs for illustrating luminous efficiency of a display device according to embodiments of the present disclosure.
Figure 7B:
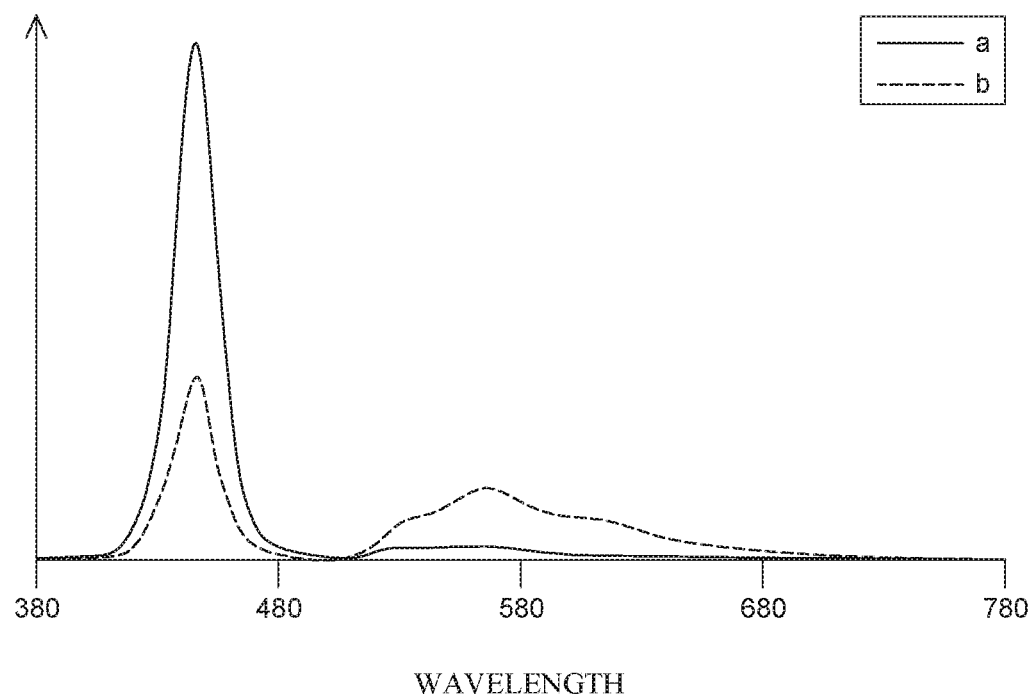

FIGS. 7A and 7B are graphs for illustrating luminous efficiency of a display device according to one or more embodiments of the present disclosure.

Referring first to FIG. 7A, the graph shows the luminous efficiency depending on the concentration of the color conversion material in the extended light path layer 150.

In the graph shown of FIG. 7A, Curve a represents the luminous efficiency of the extended light path layer containing 0.1 g of a color conversion material in 22 ml of a transparent base material. Curve b represents the luminous efficiency of the extended light path layer containing 0.3 g of a color conversion material in 22 ml of a transparent base material. Curve c represents the luminous efficiency of the extended light path layer containing 0.5 g of a color conversion material in 22 ml of a transparent base material. Curve d represents the luminous efficiency of the extended light path layer containing 0.7 g of a color conversion material in 22 ml of a transparent base material.

As can be seen from FIG. 7A that the luminous efficiency is improved as the concentration of the color conversion material contained in the extended light path layer 150 is decreased. It is, however, to be noted that the luminous efficiency may vary depending on the kind of the color conversion material. As described above, the color conversion material may be made of a phosphor or quantum dots. If the concentration is too low, the luminous efficiency may be rather poor depending on which of the phosphor, quantum dots and other color conversion materials is contained in the extended light path layer 150. Accordingly, there may be an optimal lowest point. For example, assuming that 22 ml of the transparent base material is included in the extended light path layer, the lowest point of the color conversion material may be 0.1 g. In FIG. 7A, when 0.1 g of the color conversion material is contained in 22 ml of the transparent base material, the best luminous efficiency is exhibited. However, when the color conversion material is contained less than 0.1 g, the luminous efficiency may be rather poor. Accordingly, the lowest point of the conversion material may be 0.1 g in some embodiments.

Subsequently, the graph of FIG. 7B will be described. FIG. 7B is a graph showing the luminous efficiency depending on the light path.

Referring to FIG. 7B, Curve a represents the luminous efficiency of a comparative example display device, and Curve b represents the luminous efficiency of the display device according to an embodiment of the present disclosure.

It can be seen from FIG. 7B that Curve a represents good luminous efficiency only in a particular wavelength band, especially a wavelength band from 400 to 480 nm, i.e., only in the blue wavelength band, while it represents poor luminous efficiency in the other wavelength bands. When the red sub-pixels, the green sub-pixels and the blue sub-pixels include LEDs of the same color and the color conversion layer is disposed above them, the blue LEDs are usually employed. Consequently, the luminous efficiency is good in the blue wavelength band.

In contrast, Curve b exhibits that the luminous efficiency is also good in the other wavelength bands, i.e., the green wavelength band. Accordingly, it can be seen that the luminous efficiency is better on average as the light path is longer, like in the display device 100 according to one or more embodiments of the present disclosure.

Some of the various embodiments of the present disclosure can also be described as follows:

According to an embodiment of the present disclosure, there is provided a display device. The display device may include a substrate having a sub-pixel area. A light-emitting diode (LED) and a thin-film transistor are disposed on the substrate in the sub-pixel area. An extended light path layer is configured to surround the sub-pixel area. The transistor may be configured to control the LED, and the extended light path layer may be extended in a horizontal direction of the sub-pixel area.

In some embodiments, the LED and the thin-film transistor may be disposed such that they do not overlap with each other in the sub-pixel area, and the extended light path layer may overlap the transistor and may form a light path is formed through which light emitted from the LED is transmitted to a location overlapping the transistor.

In some embodiments, the extended light path layer may contain a color conversion material.

In some embodiments, the extended light path layer further may contain a diffusing agent.

In some embodiments, a display device may include a reflective layer on the extended light path layer.

In some embodiments, the reflective layer may at least partially cover at least one side of the extended light path layer.

In some embodiments, a display device may include a second or bottom reflective layer disposed between the substrate and the LED.

In some embodiments, the extended light path layer may have a groove formed in line with or overlapped with the LED.

In some embodiments, a reflective layer may be disposed on the extended light path layer in line with the LED, and the reflective layer may be disposed along the groove formed in the extended light path layer.

In some embodiments, a display device may include a substrate having a plurality of sub-pixels; a thin-film transistor disposed in an emission area of each of the sub-pixels; at least one LED disposed in a reflection area of each of sub-pixels; an extended light path layer disposed in the emission area and the reflection area; and a first reflective layer disposed on the extended light path layer in the reflection area. The emission area does not overlap with the reflection area.

In some embodiments, a second reflective layer may be disposed between the substrate and the LED in the reflection area.

In some embodiments, a groove may be formed in the extended light path layer disposed in the reflection area.

In some embodiments, the first reflective layer may be formed along a shape of the groove.

In one or more embodiments, the present disclosure provides a display device including a substrate, a transistor on the substrate, and a light-emitting diode (LED) on the substrate and electrically coupled to the transistor. An extended light path layer overlies the transistor and the LED, and the extended light path layer is configured to receive light emitted by the LED and to transmit the light to an emission area overlying the transistor.

In some embodiments, the emission area may be spaced laterally apart from the LED.

In some embodiments, the emission area may include a first emission area and a second emission area, the LED being located between the first emission area and the second emission area.

In some embodiments, the extended light path layer may have a shape of a parallelepiped or a cylinder.

In some embodiments, the extended light path layer may be configured to convert a first color of light emitted by the LED to a second color of light.

In some embodiments, the display device may include a first reflective layer overlying the LED.

In some embodiments, the display device may include a second reflective layer between the substrate and the LED, the first reflective layer overlying the second reflective layer.

Although the embodiments of the present disclosure have been described in detail with reference to the accompanying drawings, it is to be understood that the present disclosure is not limited to those embodiments and various changes and modifications may be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Therefore, it should be understood that the above-described embodiments are illustrative in all aspects and not restrictive.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a substrate having a sub-pixel area;
   a light-emitting diode (LED) and a transistor on the substrate in the sub-pixel area; and
   an extended light path layer configured to surround the sub-pixel area,
   wherein the transistor is configured to control the LED, and the extended light path layer is extended in a horizontal direction of the sub-pixel area,
   wherein the LED and the transistor are non-overlapping with each other in the sub-pixel area, and
   wherein the extended light path layer overlies the transistor and the LED, and the extended light path layer is configured to receive light emitted by the LED and to transmit the light to an area overlying the transistor.

2. The display device of claim 1, wherein the extended light path layer contains a color conversion material.

3. The display device of claim 2, wherein the extended light path layer further contains a diffusing agent.

4. The display device of claim 2, further comprising: a first reflective layer on the extended light path layer.

5. The display device of claim 4, wherein the first reflective layer at least partially covers at least one side of the extended light path layer.

6. The display device of claim 5, further comprising: a second reflective layer disposed between the substrate and the LED.

7. The display device of claim 2, wherein the extended light path layer has a groove overlapped with the LED.

8. The display device of claim 7, further comprising:
   a reflective layer disposed on the extended light path layer, wherein the reflective layer is disposed along the groove.

9. A display device comprising:
   a substrate having a plurality of sub-pixels;
   a thin-film transistor disposed in an emission area of each of the sub-pixels;
   at least one light-emitting diode (LED) disposed in a reflection area of each of sub-pixels;
   an extended light path layer disposed in the emission area and the reflection area; and
   a first reflective layer disposed on the extended light path layer in the reflection area, wherein the emission area does not overlap with the reflection area,
   wherein the LED and the thin-film transistor are non-overlapping with each other in each of the sub-pixels, and
   wherein the extended light path layer overlies the thin-film transistor and the LED, and the extended light path layer is configured to receive light emitted by the LED and to transmit the light to an area overlying the thin-film transistor.

10. The display device of claim 9, further comprising a second reflective layer disposed between the substrate and the LED in the reflection area.

11. The display device of claim 9, wherein a groove is formed in the extended light path layer disposed in the reflection area.

12. The display device of claim 11, wherein the first reflective layer is formed along a shape of the groove.

13. A display device, comprising:
    a substrate;
    a transistor on the substrate;
    a light-emitting diode (LED) on the substrate and electrically coupled to the transistor; and
    an extended light path layer overlying the transistor and the LED, the extended light path layer configured to receive light emitted by the LED and to transmit the light to an emission area overlying the transistor,
    wherein the LED and the transistor are non-overlapping with each other.

14. The display device of claim 13 wherein the emission area is spaced laterally apart from the LED.

15. The display device of claim 14 wherein the emission area includes a first emission area and a second emission area, the LED being located between the first emission area and the second emission area.

16. The display device of claim 13 wherein the extended light path layer has a shape of a parallelepiped or a cylinder.

17. The display device of claim 13 wherein the extended light path layer is configured to convert a first color of light emitted by the LED to a second color of light.

18. The display device of claim 13, further comprising:
    a first reflective layer overlying the LED.

19. The display device of claim 18, further comprising:
    a second reflective layer between the substrate and the LED, the first reflective layer overlying the second reflective layer.

* * * * *